(12) United States Patent
Yang

(10) Patent No.: US 8,097,527 B2
(45) Date of Patent: Jan. 17, 2012

(54) METHOD OF FORMING EPITAXIAL LAYER

(75) Inventor: Cheol-Hoon Yang, Gyeonggi-do (KR)

(73) Assignee: Jusung Engineering Co. Ltd., Gwangju-si, Gyeonggi-do (KR)

( * ) Notice: Subject to any disclaimer, the term of this patent is extended or adjusted under 35 U.S.C. 154(b) by 0 days.

(21) Appl. No.: 12/171,157

(22) Filed: Jul. 10, 2008

(65) Prior Publication Data

US 2009/0017603 A1 Jan. 15, 2009

(30) Foreign Application Priority Data

Jul. 11, 2007 (KR) .................. 10-2007-0069433

(51) Int. Cl.
*H01L 21/20* (2006.01)
*H01L 21/3065* (2006.01)

(52) U.S. Cl. ........ 438/478; 438/503; 438/677; 438/710; 257/E21.102

(58) Field of Classification Search .................. 438/478, 438/503, 677, 710; 257/E21.102
See application file for complete search history.

(56) References Cited

U.S. PATENT DOCUMENTS

| 6,692,903 | B2 * | 2/2004 | Chen et al. ..................... 430/329 |
| 2003/0045063 | A1 * | 3/2003 | Oda ............................... 438/309 |
| 2005/0130434 | A1 * | 6/2005 | Chien et al. .................... 438/706 |
| 2006/0169668 | A1 * | 8/2006 | Samoilov ........................ 216/58 |
| 2006/0254506 | A1 * | 11/2006 | Ramaswamy et al. ........ 117/105 |

* cited by examiner

*Primary Examiner* — Tuan N. Quach
(74) *Attorney, Agent, or Firm* — Portland IP Law LLC

(57) ABSTRACT

A method of forming an epitaxial layer on a silicon substrate includes (a) providing a silicon substrate; (b) performing a wet-cleaning process onto the silicon substrate; (c) performing a first plasma cleaning process onto the wet-cleaned silicon substrate by providing a chlorine ($Cl_2$) gas and an argon (Ar) gas; and (d) forming an epitaxial growth film on the silicon substrate after the (c) step.

7 Claims, 3 Drawing Sheets

METHOD OF FORMING EPITAXIAL LAYER

CROSS-REFERENCE TO RELATED PATENT APPLICATIONS

This application claims the benefit of Korean Patent Application No. 2007-0069433, filed on Jul. 11, 2007, in the Korean Intellectual Property Office, the disclosure of which is incorporated herein in its entirety by reference.

BACKGROUND OF THE INVENTION

The present invention relates to a semiconductor device, and more particularly, to a method of forming an epitaxial layer being capable of removing contaminants on a surface of the silicon substrate where an epitaxial growth layer is formed.

SUMMARY OF THE INVENTION

Generally, in a semiconductor device using a silicon (Si) substrate, a thin film having the same crystal structure as the Si substrate is grown on the Si substrate along a crystal axis of the Si substrate. It may be referred to as an epitaxial growing method. And the thin film may be referred to as an epitaxial growth film. The epitaxial growth begins with a temperature of about 500 to about 650 centigrade. The substrate may include not only the Si substrate but also an insulating monocrystal substrate. The epitaxial growth film includes a material, such as silicon (Si), silicon-germanium (SiGe) and silicon-carbon (SiC), having the same lattice structure as or very similar lattice structure to a silicon (Si) material.

FIGS. 1A and 1B are cross-sectional views of a semiconductor device including the related art epitaxial growth film, respectively, and FIG. 2 is a schematic cross-sectional view of an apparatus for forming the related art epitaxial growth film.

In FIG. 1A, the semiconductor device includes a gate insulating layer 13 on a silicon substrate 11, a gate electrode 15 of a conductive material and a side wall 17 surrounding sides of the gate electrode 15. The side wall 17 is formed by an isotropic etching method. In more detail, an insulating material layer is formed on the silicon substrate 11 including the gate electrode 15. Then, the insulating material layer is patterned by the isotropic etching method. When the side wall 17 is formed, the gate insulating layer 13 between adjacent gate electrodes 15 is also etched such that a surface of the silicon substrate 11 is exposed. Then, an epitaxial growth film 51 of one of Si, SiGe and SiC is formed on the exposed surface of the silicon substrate 11 between adjacent gate electrodes 15. The epitaxial growth film 51 is formed by the epitaxial growing method and has a mono-crystal. In this case, since the surface of the silicon substrate 11 between adjacent gate electrodes 15 is exposed to air, there are undesired oxidation layer or/and contaminants on the surface of the silicon substrate 11.

In FIG. 1B, in another method for forming the semiconductor device, after the side wall 17 is formed, an exposed surface of the silicon substrate 11 is etched such that a recess region 31 is formed. Then, an epitaxial growth film 51 of one of Si, SiGe and SiC is formed on the exposed in the recess region 31. The epitaxial growth film 51 is formed by the epitaxial growing method and has a mono-crystal. In this case, a surface of the silicon substrate 11 in the recess region 31 is exposed to air, there are also undesired oxidation layer or/and contaminants on the surface of the silicon substrate 11.

Accordingly, to prevent the undesired oxidation layer or/and contaminants being formed on the surface of the silicon substrate 11, the silicon substrate 11 is wet-cleaned using a diluted fluoric acid (HF) solution before the epitaxial growth process. The fluoric acid is diluted by distilled water. After fine dusts, organics, an oxidation layer on the silicon substrate 11 are removed in the wet-cleaning process, the silicon substrate 11 is transferred into a process chamber for the epitaxial growth process. The epitaxial growth process in the process chamber is explained with reference to FIG. 2.

In FIG. 2, an apparatus 21 includes a process chamber 23, a susceptor 25 and a source material providing unit (not shown). The process chamber 23 provides a reaction space. The susceptor 25 is disposed in the reaction space of the process chamber 23 and a substrate 11 is disposed thereon. The source material providing unit (not shown) is disposed over the susceptor 25 and provides an epitaxial source material. In addition, the apparatus 21 includes a first radio frequency (RF) power source 27, a second RF power source 29, a first gas supplying unit 33 including a first flux controller 31 and a second gas supplying unit 37 including a second flux controller 35. The first RF power source 27 is connected to an upper wall of the process chamber 23 and the second RF power source 29 is connected to the susceptor 25 to generate plasma in the reaction space of the process chamber 23. The first and gas supplying units 33 and 37 provide a sulfur hexafluoride ($SF_6$) gas and a hydrogen ($H_2$) gas into the reaction space of the process chamber 23, respectively, to perform a cleaning process on the substrate 11 before forming the epitaxial growth film 51 (of FIGS. 1A and 1B).

Since a diluted fluoric acid (HF) solution by distilled water is used for the wet-cleaning process, an oxidation layer may be generated on the substrate 11 due to the distilled water. Moreover, $SF_6$ molecules and organics remain on the substrate 11 to function as contaminants. To obtain a desired epitaxial growth layer 51, the oxidation layer and the contaminants, such as $SF_6$ molecules and organics, should be removed. Accordingly, after the substrate 11 is wet-cleaned, the substrate 11 is cleaned again by a plasma cleaning process. In the plasma cleaning process, a cleaning gas including a sulfur hexafluoride ($SF_6$) gas and a hydrogen ($H_2$) gas is provided into the reaction space of the process chamber 23. A ratio of the sulfur hexafluoride ($SF_6$) gas to a hydrogen ($H_2$) gas may be 1:20. The epitaxial growth layer 51 is grown after the plasma cleaning process.

The oxidation layer generated in the wet-cleaning process is removed by the plasma cleaning process. However, there are contaminants on the substrate 11 by the cleaning gas including sulfur (S) and fluoride (F) after the plasma cleaning process. The contaminants, such as sulfur (S) and fluoride (F), cause a facet defect 21, as shown in FIG. 1A. Moreover, they cause a stacking fault 19 and a line or plane defect 31, as shown in FIG. 1B. As a result, properties of the epitaxial growth film 51 are deteriorated.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments which are illustrated in the accompanying drawings. Wherever possible, similar reference numbers will be used to refer to the same or similar parts.

Figure 1A:
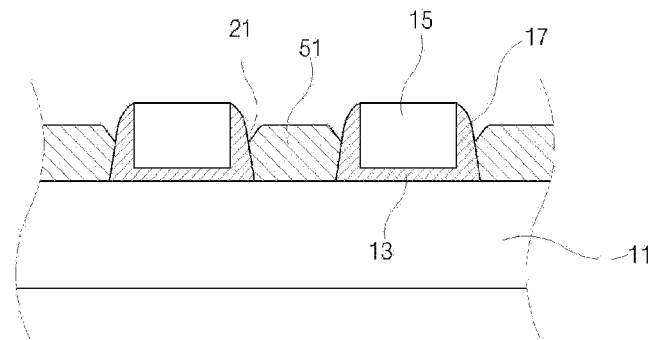
FIGS. 1A and 1B are cross-sectional views of a semiconductor device including the related art epitaxial growth film, respectively.
Figure 1B:
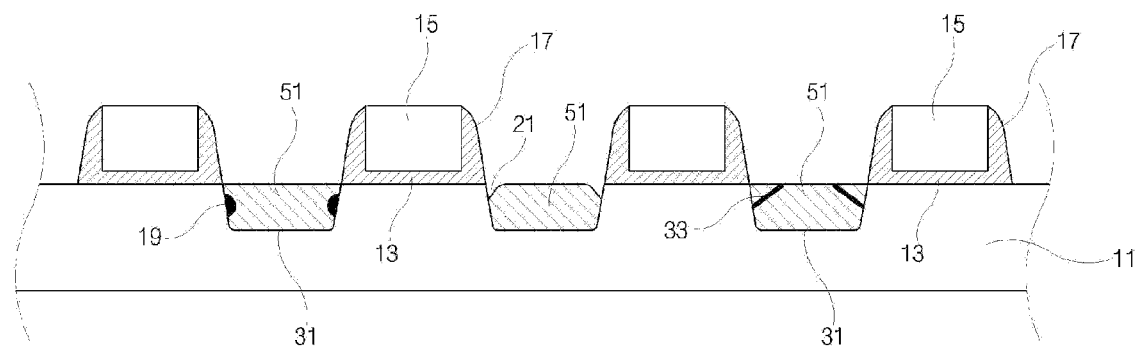
Figure 2:
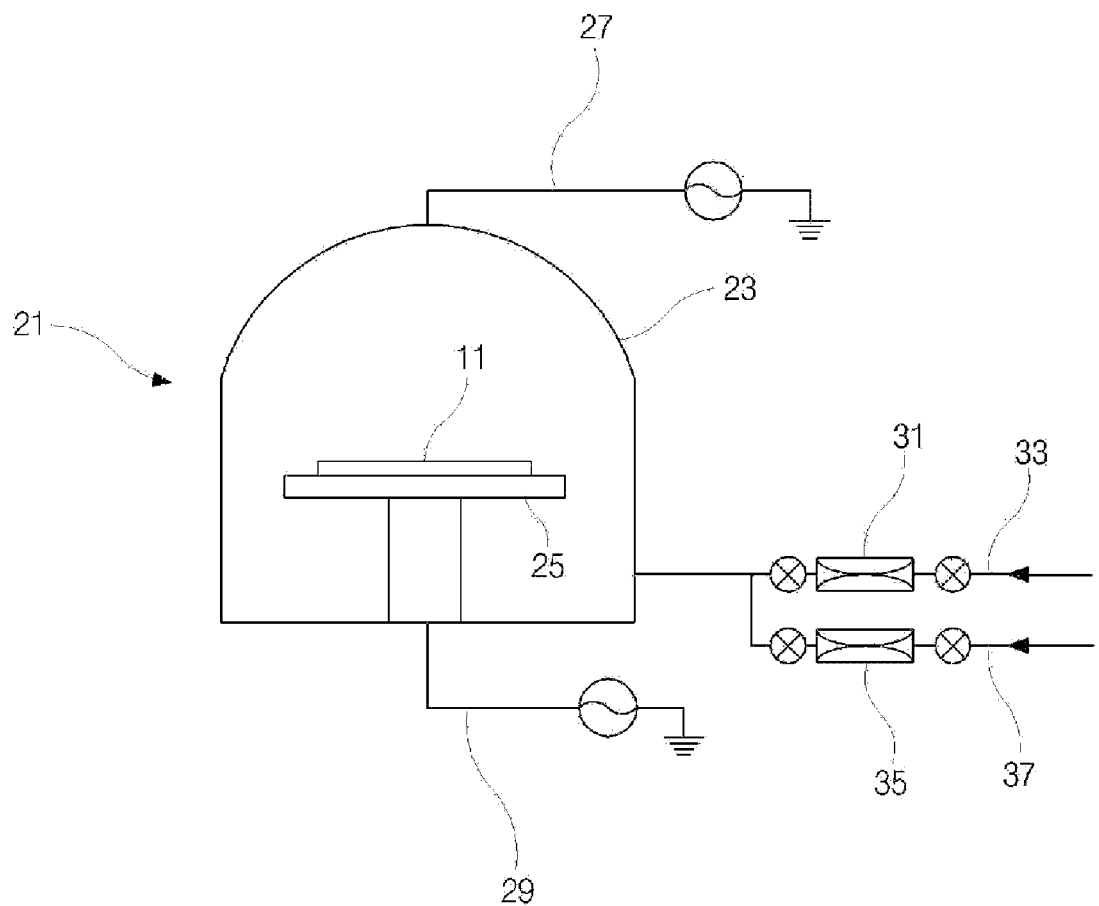
FIG. 2 is a schematic cross-sectional view of an apparatus for forming the related art epitaxial growth film.
Figure 3A:
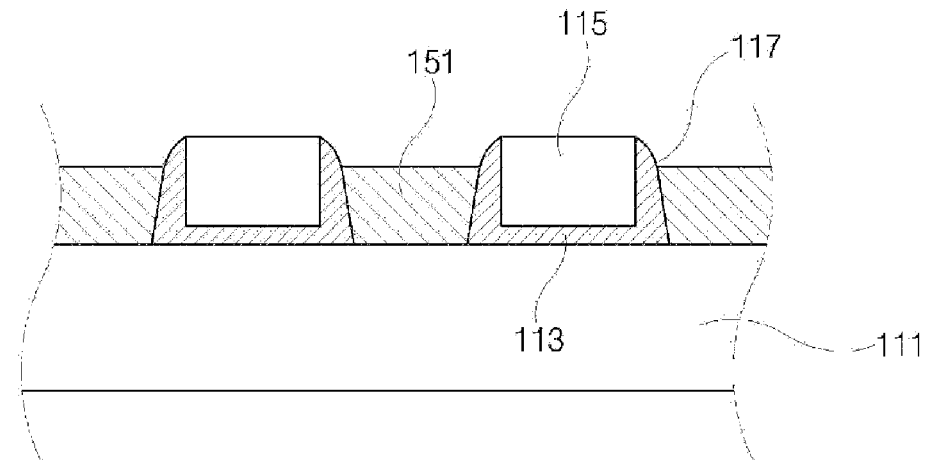
FIGS. 3A and 3B are cross-sectional views of a semiconductor device including an epitaxial growth film according to the present invention, respectively.
Figure 3B:
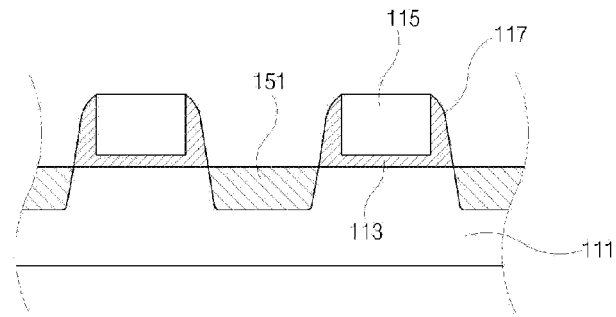
Figure 4:
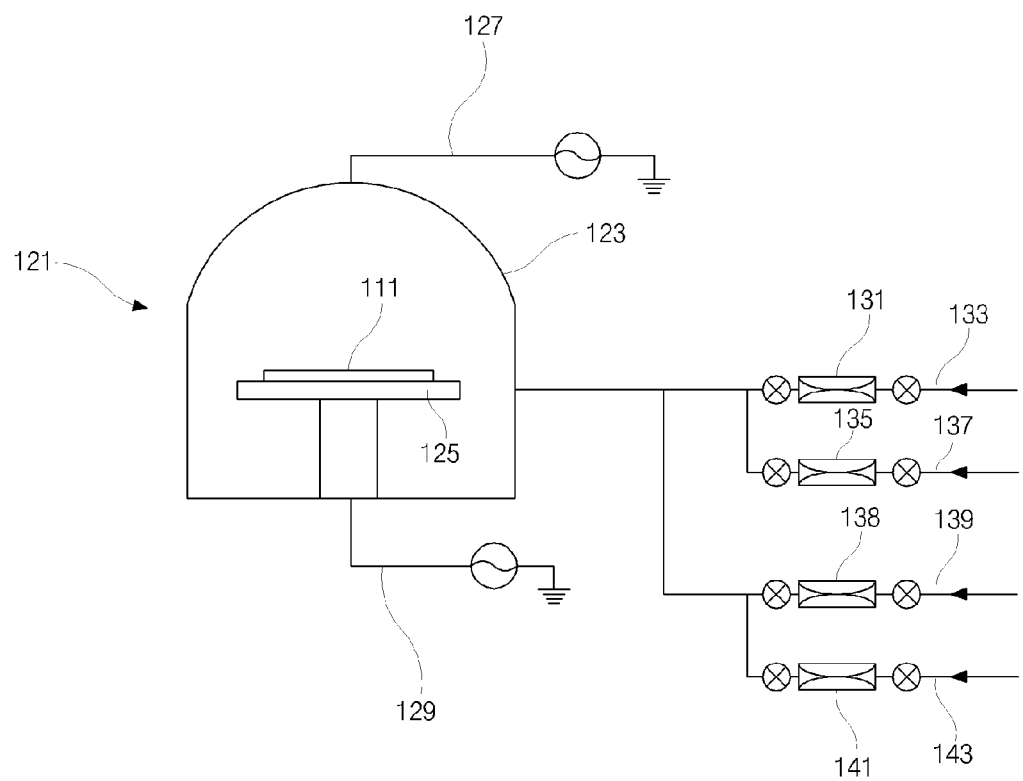
FIG. 4 is a schematic cross-sectional view of an apparatus for forming an epitaxial growth film according to the present invention.

FIGS. 3A and 3B are cross-sectional views of a semiconductor device including an epitaxial growth film according to the present invention, respectively, and FIG. 4 is a schematic cross-sectional view of an apparatus for forming an epitaxial growth film according to the present invention.

In FIG. 3A, a semiconductor device includes a gate insulating layer 113 on a silicon substrate 111, a gate electrode 115 of a conductive material and a side wall 117 surrounding sides of the gate electrode 115. The side wall 117 is formed by an isotropic etching method. In more detail, an insulating material layer is formed on the silicon substrate 111 including the gate electrode 115. Then, the insulating material layer is patterned by the isotropic etching method. When the side wall 117 is formed, the gate insulating layer 113 between adjacent gate electrodes 115 is also etched such that a surface of the silicon substrate 111 is exposed. Then, an epitaxial growth film 151 is formed on the exposed surface of the silicon substrate 111 between adjacent gate electrodes 115. The epitaxial growth film 51 is formed by the epitaxial growing method and has a mono-crystal. The epitaxial growth film 51 includes one of silicon (Si), silicon-germanium (SiGe) and silicon-carbon (SiC). In FIG. 3B, in another method for forming the semiconductor device, after the side wall 117 is formed, an exposed surface of the silicon substrate 111 is etched such that a recess region 131 is formed. Then, an epitaxial growth film 151 is formed on the exposed in the recess region 31. The epitaxial growth film 151 is formed by the epitaxial growing method and has a mono-crystal. The epitaxial growth films 151 at both sides of the gate electrode 151 function as a source electrode and a drain electrode, respectively. The source and drain electrodes in FIG. 3A may be referred to as an elevated source/drain structure, while the source and drain electrodes in FIG. 3B may be referred to as a recessed source/drain structure. Each of the elevated source/drain structure and the recessed source/drain structure causes improved properties in the semiconductor device, e.g., a thin film transistor.

In FIGS. 3A and 3B, since a surface of the silicon substrate 11 between adjacent gate electrodes 115 is exposed to air, there are an oxidation layer and various contaminants on the silicon substrate 111. To removes the oxidation layer and various contaminants, for example, fine dusts or organics, a wet-cleaning process is performed onto the substrate 111 using a fluoric acid (HF) solution diluted by distilled water. Then, the substrate 111 is transferred into an apparatus 121 (of FIG. 4) to perform an epitaxial growing process. After the wet-cleaning process, the substrate 111 is transferred into the apparatus 121 as soon as possible to prevent additional oxidation layer from forming on the substrate 111.

In FIG. 4, an apparatus 121 includes a process chamber 123, a susceptor 125 and a source material providing unit (not shown). The process chamber 123 provides a reaction space. The susceptor 125 is disposed in the reaction space of the process chamber 123 and a substrate 111 is disposed thereon. The source material providing unit (not shown) is disposed over the susceptor 125 and provides an epitaxial source material. The epitaxial source material may include one of silicon (Si), silicon-germanium (SiGe) and silicon-carbon (SiC). In addition, the apparatus 121 includes a first radio frequency (RF) power source 127, a second RF power source 129, a first gas supplying unit 133 including a first flux controller 131, a second gas supplying unit 137 including a second flux controller 135, a third gas supplying unit 139 including a third flux controller 138 and a fourth gas supplying unit 143 including a fourth flux controller 141. The first RF power source 127 is connected to an upper wall of the process chamber 123 and the second RF power source 129 is connected to the susceptor 125 to generate plasma in the reaction space of the process chamber 123. The first gas supplying unit 133 provides a chlorine ($Cl_2$) gas, and the second gas supplying unit 137 provides a sulfur hexafluoride ($SF_6$) gas. Flux of the chlorine ($Cl_2$) gas and the sulfur hexafluoride ($SF_6$) gas are controlled by the first and second flux controllers 131 and 135, respectively. The third gas supplying unit 139 provides an argon (Ar) gas, and the fourth gas supplying unit 143 provides a hydrogen ($H_2$) gas. Flux of the argon (Ar) gas and the hydrogen ($H_2$) gas are controlled by the third and fourth flux controllers 138 and 141, respectively. At least two gases are provided into the reaction chamber 123 by the first to fourth gas supplying units 133, 137, 139, 143. Then, power sources are applied such that plasma is excited. As a result, the oxidation layers or/and the contaminants on the silicon substrate 111 can be removed.

As mentioned above, before an epitaxial growth film is formed on the silicon substrate by an epitaxial growing method using one of Si, SiGe and SiC, the substrate is cleaned by a plasma cleaning method as following first to fourth embodiments.

A First Embodiment

After the wet-cleaning process on the silicon substrate 111, a dry-cleaning process, e.g., a plasma cleaning process, and an epitaxial growing process for forming an epitaxial growth film 151 are performed in a single process chamber. The first gas supplying unit 133 and the third gas supplying unit 139 respectively provide the chlorine ($Cl_2$) gas and the argon gas (Ar) into a reaction space of the process chamber 123. The first and third flux controllers 131 and 138 control flux of the chlorine ($Cl_2$) gas and the argon gas (Ar) such that a ratio of the chlorine ($Cl_2$) gas to the argon gas (Ar) is 1:1 to 20:1. In addition, a power of about 20 to about 500 watts is applied to generate plasma. The process chamber 123 has a process temperature of about 400 to about 700 centigrade such that the oxidation layer, the contaminants including undesired impurities generated in the wet-cleaning process are removed from the silicon substrate 111. The process temperature in the plasma cleaning process is substantially equal to a process temperature in the epitaxial growing process.

If the process chamber in the plasma cleaning process has a different process temperature than that in the epitaxial growing process, it is required to control a temperature of the process chamber in the epitaxial growing process after the plasma cleaning process. Accordingly, to improve efficiency, the process temperature in the plasma cleaning process is substantially equal to that in the epitaxial growing process.

By the plasma cleaning process using the chlorine ($Cl_2$) gas and the argon gas (Ar), the contaminants and the impurities generated in the wet-cleaning process, for example, fluorine (F) molecules or fluorine (F) compound, are removed. In more details, the chlorine ($Cl_2$) gas is activated by plasma to form a compound, e.g., $Si_xCl_y$. As a result, a surface of the silicon substrate 111 is etched and the contaminants and the impurities on the silicon substrate 111 are removed at the same time.

Next, the epitaxial source material is provided into the reaction space of the process chamber 123 by the source material providing unit (not shown) to form the epitaxial growth film 151.

A Second Embodiment

After the wet-cleaning process on the silicon substrate 111, first and second dry-cleaning processes, e.g., a plasma cleaning process, and an epitaxial growing process for forming an epitaxial growth film 151 are performed in a single process chamber.

In the first dry-cleaning process, which may be referred to a first plasma cleaning process, the second gas supplying unit 137 and the third gas supplying unit 139 respectively provide the sulfur hexafluoride ($SF_6$) gas and the argon gas (Ar) into a reaction space of the process chamber 123. In addition, a power of about 20 to about 500 watts is applied to generate plasma. The process chamber 123 has a process temperature of about 400 to about 700 centigrade such that the oxidation layer, the contaminants including undesired impurities, e.g., fluorine (F) molecules, generated in the wet-cleaning process are removed from the silicon substrate 111. In this case, the hydrogen ($H_2$) gas may be provided by the fourth gas supplying unit 143 instead of the argon gas (Ar). By the first plasma cleaning process using the sulfur hexafluoride ($SF_6$) gas and the argon gas (Ar) (or the hydrogen ($H_2$) gas), the contaminants and the impurities generated in the wet-cleaning process, for example, fluorine (F) molecules or fluorine (F) compound, are removed.

Next, in the second dry-cleaning process, which may be referred to as a second plasma cleaning process, the first gas supplying unit 133 and the third gas supplying unit 139 respectively provide the chlorine ($Cl_2$) gas and the argon gas (Ar) into a reaction space of the process chamber 123. The first and third flux controllers 131 and 138 control flux of the chlorine ($Cl_2$) gas and the argon gas (Ar) such that a ratio of the chlorine ($Cl_2$) gas to the argon gas (Ar) is 1:1 to 20:1. In addition, a power of about 20 to about 500 watts is applied to generate plasma. The process chamber 123 has a process temperature of about 400 to about 700 centigrade such that the oxidation layer, the contaminants including undesired impurities generated in the wet-cleaning process are removed from the silicon substrate 111. By the second plasma cleaning process using the chlorine ($Cl_2$) gas and the argon gas (Ar), the contaminants and the impurities, which include sulfur (S) molecules and fluorine (F) molecules and may be generated in the first plasma cleaning process, are removed. In more details, the chlorine ($Cl_2$) gas is activated by plasma to form a compound, e.g., $Si_xCl_y$. As a result, a surface of the silicon substrate 111 is etched and the contaminants and the impurities on the silicon substrate 111 are removed at the same time. After the second plasma cleaning process, the epitaxial source material is provided into the reaction space of the process chamber 123 by the source material providing unit to form the epitaxial growth film 151.

A Third Embodiment

After the wet-cleaning process on the silicon substrate 111, a first dry-cleaning process, e.g., a plasma cleaning process, and an epitaxial growing process for forming an epitaxial growth film 151 are performed in different process chambers.

The silicon substrate 111 is transferred into a first process chamber after the wet-cleaning process. The first gas supplying unit 133 and the third gas supplying unit 139 respectively provide the chlorine ($Cl_2$) gas and the argon gas (Ar) into a reaction space of the first process chamber. The first and third flux controllers 131 and 138 control flux of the chlorine ($Cl_2$) gas and the argon gas (Ar) such that a ratio of the chlorine ($Cl_2$) gas to the argon gas (Ar) is 1:1 to 20:1. In addition, a power of about 20 to about 500 watts is applied to generate plasma. The first process chamber has a process temperature of about 150 to about 300 centigrade such that the oxidation layer, the contaminants including undesired impurities, for example, fluorine (F) molecules or fluorine (F) compounds, generated in the wet-cleaning process are removed from the silicon substrate 111. In more details, the chlorine ($Cl_2$) gas is activated by plasma to form a compound, e.g., $Si_xCl_y$. As a result, a surface of the silicon substrate 111 is etched and the contaminants and the impurities on the silicon substrate 111 are removed at the same time.

The silicon substrate 111 is transferred to a second process chamber after the plasma cleaning process. The, the epitaxial source material is provided into the reaction space of the second process chamber by the source material providing unit to form the epitaxial growth film 151.

A Fourth Embodiment

After the wet-cleaning process on the silicon substrate 111, a first dry-cleaning process, which may be referred to as a first plasma cleaning process, is performed in a first process chamber, and a second dry-cleaning process, which may be referred to as a second plasma cleaning process, and an epitaxial growing process for forming an epitaxial growth film 151 are performed in a single process chamber different from the first process chamber. The single process chamber where the first plasma cleaning process and the epitaxial growing process are performed may be referred to as a second process chamber.

The silicon substrate 111 is transferred into the first process chamber after the wet-cleaning process to perform the first cleaning process. In the first dry-cleaning process, the second gas supplying unit 137 and the third gas supplying unit 139 respectively provide the sulfur hexafluoride ($SF_6$) gas and the argon gas (Ar) into a reaction space of the first process chamber. In addition, a power of about 20 to about 500 watts is applied to generate plasma. The first process chamber has a process temperature of about 150 to about 300 centigrade such that the oxidation layer, the contaminants including undesired impurities, e.g., fluorine (F) molecules, generated in the wet-cleaning process are removed from the silicon substrate 111. In this case, the hydrogen ($H_2$) gas may be provided by the fourth gas supplying unit 143 instead of the argon gas (Ar). By the first plasma cleaning process using the sulfur hexafluoride ($SF_6$) gas and the argon gas (Ar) (or the hydrogen ($H_2$) gas), the contaminants and the impurities generated in the wet-cleaning process, for example, fluorine (F) molecules or fluorine (F) compound, are removed.

The silicon substrate 111 is transferred into the second process chamber to perform the second plasma cleaning process and the epitaxial growing process after the first plasma cleaning process. In the second plasma cleaning process, the first gas supplying unit 133 and the third gas supplying unit 139 respectively provide the chlorine ($Cl_2$) gas and the argon gas (Ar) into a reaction space of the process chamber 123. The first and third flux controllers 131 and 138 control flux of the chlorine ($Cl_2$) gas and the argon gas (Ar) such that a ratio of the chlorine ($Cl_2$) gas to the argon gas (Ar) is 1:1 to 20:1. In addition, a power of about 20 to about 500 watts is applied to generate plasma. The process chamber 123 has a process temperature of about 400 to about 700 centigrade such that the oxidation layer, the contaminants including undesired impurities generated in the wet-cleaning process are removed from the silicon substrate 111. By the second plasma cleaning process using the chlorine ($Cl_2$) gas and the argon gas (Ar), the contaminants and the impurities, which include sulfur (S) molecules and fluorine (F) molecules and may be generated in the first plasma cleaning process, are removed. Sequentially, the epitaxial source material is provided into the reaction space of the second process chamber by the source material providing unit to form the epitaxial growth film 151.

On the other hand, the first and second plasma cleaning processes are performed in one process chamber, and the epitaxial growing process is performed in the other process chamber.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of forming an epitaxial layer on a silicon substrate, comprising:
   (a) providing a silicon substrate;
   (b) performing a wet-cleaning process onto the silicon substrate by using a fluoric acid (HF) solution diluted by distilled water;
   (c) performing a first plasma cleaning process onto the silicon substrate by providing a sulfur hexafluoride ($SF_6$) gas and one of the argon gas (Ar) and a hydrogen ($H_2$) gas, wherein fluorine (F) molecule or fluorine (F) compound generated in the wet-cleaning process are removed by the first plasma cleaning process;
   (d) after step (c), performing a second plasma cleaning process onto the wet-cleaned silicon substrate by providing a chlorine ($Cl_2$) gas and an argon (Ar) gas, wherein contaminants and impurities including sulfur (S) molecules and fluorine (F) molecules are generated in the first plasma cleaning process, and the contaminants and impurities are removed by the second plasma cleaning process; and
   (e) forming an epitaxial growth film on the silicon substrate after the step (d).

2. The method according to claim 1, wherein the steps (c), (d) and (e) are performed in a single process chamber having a process temperature of about 400 to about 700° C.

3. A method of forming an epitaxial layer on a silicon substrate, comprising
   (a) providing a silicon substrate;
   (b) performing a wet-cleaning process onto the silicon substrate;
   (c) preparing an apparatus including a first process chamber providing a reaction space, a susceptor disposed in the reaction space, and a gas supply unit, a first RF power source connected to an upper wall of the first process chamber and a second RF power source connected to the susceptor, wherein a plasma is generated in the reaction space by the first and second RF power source;
   (d) performing a first plasma cleaning process onto the silicon substrate by providing a sulfur hexafluoride ($SF_6$) gas and one of the argon (Ar) and a hydrogen ($H_2$) gas;
   (e) after step (d), performing a second plasma cleaning process onto the wet-cleaned silicon substrate by providing a chlorine ($Cl_2$) gas and an argon (Ar) gas, wherein contaminants and impurities including sulfur (S) molecules and fluorine (F) molecules are generated in the first plasma cleaning process, and the contaminants and impurities are removed by the second plasma cleaning process; and
   (f) forming an epitaxial growth film on the silicon substrate after the step (e).

4. The method according to claim 3, wherein the apparatus includes a second process chamber.

5. The method according to claim 4, wherein the (d) step is performed in one of the first process chamber and the second process chamber, and the steps (e) and (f) steps are performed in the other one of the first process chamber and the second process chamber.

6. The method according to claim 3, wherein the epitaxial growth film includes one of silicon (Si), silicon-germanium (SiGe) and silicon-carbon (SiC).

7. The method according to claim 3, wherein the steps (e) and (f) are performed in a single process chamber having a process temperature of about 400 to about 700° C.

* * * * *